(12) United States Patent
Hasson et al.

(10) Patent No.: US 9,136,838 B2
(45) Date of Patent: *Sep. 15, 2015

(54) RF SWITCH IMPLEMENTATION IN CMOS PROCESS

(75) Inventors: Yaron Hasson, Elad (IL); Alex Mostov, Rishon Lezion (IL)

(73) Assignee: DSP GROUP LTD., Herzelia (IL)

( * ) Notice: Subject to any disclaimer, the term of this patent is extended or adjusted under 35 U.S.C. 154(b) by 138 days.

This patent is subject to a terminal disclaimer.

(21) Appl. No.: 13/823,367

(22) PCT Filed: Sep. 21, 2010

(86) PCT No.: PCT/IL2010/000787
§ 371 (c)(1),
(2), (4) Date: Jun. 5, 2013

(87) PCT Pub. No.: WO2012/038947
PCT Pub. Date: Mar. 29, 2012

(65) Prior Publication Data
US 2013/0244595 A1 Sep. 19, 2013

(51) Int. Cl.
*H04B 1/46* (2006.01)
*H03K 17/687* (2006.01)
*H03K 17/693* (2006.01)
*H04B 1/525* (2015.01)
*H04B 1/44* (2006.01)

(52) U.S. Cl.
CPC .......... *H03K 17/6872* (2013.01); *H03K 17/693* (2013.01); *H04B 1/44* (2013.01); *H04B 1/525* (2013.01)

(58) Field of Classification Search
CPC .................................. H04B 1/44; H04B 1/525

USPC ................................. 455/78–83, 562.1, 575.7
See application file for complete search history.

(56) References Cited

U.S. PATENT DOCUMENTS

| | | | | |
|---|---|---|---|---|
| 5,375,257 A * | 12/1994 | Lampen | ......................... | 455/83 |
| 5,768,691 A * | 6/1998 | Matero et al. | .................. | 455/78 |
| 5,809,405 A * | 9/1998 | Yamaura | ....................... | 455/101 |
| 5,812,939 A * | 9/1998 | Kohama | ......................... | 455/78 |
| 5,991,607 A * | 11/1999 | Burdenski et al. | ............. | 455/83 |
| 6,256,495 B1 * | 7/2001 | Francisco et al. | ......... | 455/552.1 |
| 6,272,327 B1 * | 8/2001 | Kurchuk et al. | ............. | 455/217 |
| 6,653,697 B2 * | 11/2003 | Hidaka et al. | ................. | 257/393 |
| 6,671,496 B1 * | 12/2003 | Hoshi | ............................. | 455/78 |
| 7,138,846 B2 * | 11/2006 | Suwa et al. | .................. | 327/308 |
| 7,221,207 B2 * | 5/2007 | Fukumoto et al. | ............ | 327/365 |
| 7,359,677 B2 * | 4/2008 | Huang et al. | ................... | 455/83 |
| 7,719,383 B2 * | 5/2010 | Gu | ............................... | 333/101 |
| 7,915,946 B2 * | 3/2011 | Takahashi et al. | ............ | 327/427 |
| 8,093,940 B2 * | 1/2012 | Huang et al. | .................. | 327/430 |
| 8,159,283 B2 * | 4/2012 | Sugiyama | ..................... | 327/430 |
| 8,208,867 B2 * | 6/2012 | Lum et al. | ...................... | 455/78 |
| 8,476,961 B2 * | 7/2013 | Huang et al. | .................. | 327/430 |

(Continued)

*Primary Examiner* — Edward Urban
*Assistant Examiner* — Rui Hu
(74) *Attorney, Agent, or Firm* — Reches Patents

(57) ABSTRACT

A dual pole dual through switch for switching between at least four states. The switch comprises four transistors such as N-channel Metal Oxide Semiconductor transistors, such that at each state at most one transistor is in "on" state, and the others are in "off" state. Each transistor has its own control circuit, which provides zero or negative voltage to the drain of the transistor, positive voltage to the source of the transistor, and control alternating voltage to the gate of the transistor. The switch can be used on-chip for devices. Such devices may include a base station or a handset of a cordless phone.

6 Claims, 2 Drawing Sheets

(56) References Cited

U.S. PATENT DOCUMENTS

| | | | |
|---|---|---|---|
| 8,525,272 B2* | 9/2013 | Losehand et al. | 257/376 |
| 8,559,907 B2* | 10/2013 | Burgener et al. | 455/333 |
| 8,583,111 B2* | 11/2013 | Burgener et al. | 455/433 |
| 8,649,754 B2* | 2/2014 | Burgener et al. | 455/333 |
| 8,723,260 B1* | 5/2014 | Carroll et al. | 257/347 |
| 2002/0140040 A1* | 10/2002 | Hidaka et al. | 257/393 |
| 2004/0085118 A1* | 5/2004 | Numata | 327/436 |
| 2004/0116082 A1* | 6/2004 | Choi | 455/121 |
| 2007/0139094 A1* | 6/2007 | Nakatsuka et al. | 327/430 |
| 2009/0243703 A1* | 10/2009 | Furutani | 327/436 |
| 2010/0090747 A1* | 4/2010 | Sugiyama et al. | 327/437 |
| 2011/0181342 A1* | 7/2011 | Uejima et al. | 327/416 |
| 2011/0254614 A1* | 10/2011 | Huang et al. | 327/534 |
| 2012/0202438 A1* | 8/2012 | Huang et al. | 455/78 |

\* cited by examiner

RF SWITCH IMPLEMENTATION IN CMOS PROCESS

TECHNICAL FIELD

The present disclosure relates to switching in general, and to a scheme for implementing an on-chip double pole double through (DPDT) switch, in particular.

BACKGROUND

Consumer products such as communication devices and in particular wireless telephones have long become standard commodity. There is a large number of manufacturers of such devices, which leads to tough competition and pricing wars.

One of the factors that limit price reduction is the actual cost of the device components, including diodes, resistors, or capacitors, which are external to the chip or chip-set that constitute the core of the device.

However, placing such components on the device is impossible due to the different technologies used. For example, PIN diodes cannot be placed on the chip due to their unavailability in standard CMOS process.

These components which are external to the chip or chip-set increase the price of the device in a number of ways: they have to be manufactured or purchased, their assembly within the device incurs resources including equipment and labor, and they also take up areas of the Printed Circuit Board (PCB), so that larger boards are required.

There is thus a need in the art for a communication device that can be manufactured at lower costs than traditional devices, and a method for generating the same, which will enable the price reduction without affecting the capabilities of the device.

SUMMARY

An on-chip switch for selecting between various options, and a wireless device using the same.

One aspect of the disclosure relates to a switch for selecting between four options, the switch comprising four or more transistors, wherein at any time at most one transistor is in "on" state, wherein the switch is an on-chip switch. The switch is optionally a dual pole dual through switch. The switch is optionally used in a base station of a cordless phone. The switch optionally selects between two antennas and between transmitting and receiving states. Within the switch, at least one of the at least four transistors is optionally an N-channel Metal Oxide Semiconductor (NMOS) transistor. The switch can further comprise one or more control circuits providing voltage to one or more of the transistors. Within the switch, the control circuit optionally comprises: components for providing zero or negative voltage to the drain of one or more transistors; components for providing positive voltage to the source of the one or more transistors; and components for providing alternating voltage to the gate of one or more transistors. Within the switch one or more of the transistors is optionally an N-channel Metal Oxide Semiconductor.

Another Aspect of the disclosure relates to a wireless communication device having a handset and a base station, the base station comprising: a first antenna and a second antenna, each of the first antenna and the second antenna operative to transmit and receive data; and a switch for operating the first or the second antenna, in transmitting or receiving mode, the switch comprising four transistors, each of the four transistor having its own control circuit, the switch located on a chip of the base station. Within the wireless communication device, the handset optionally comprises a switch having four transistors, the switch located on a chip of the handset.

BRIEF DESCRIPTION OF THE DRAWINGS

The present disclosure will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
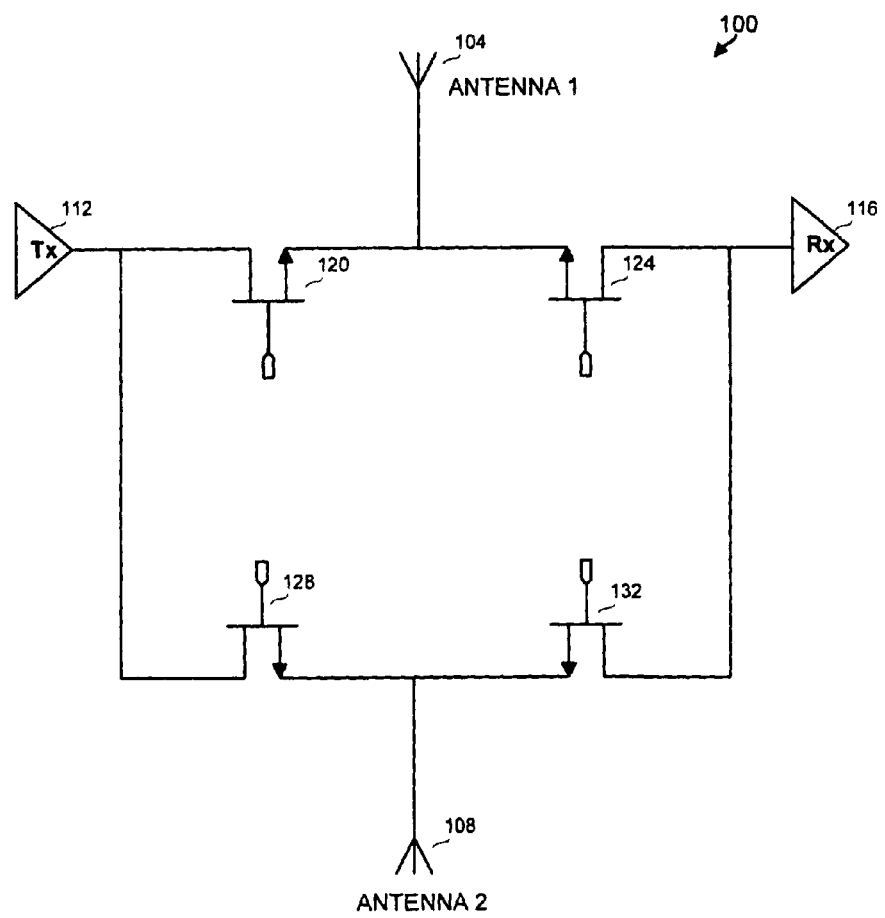
FIG. 1 is a general scheme of a four transistor implementation of a DPDT switch.

A typical cordless phone handset usually comprises one antenna, while the base station may comprise one or two antennas placed at a spatial angle to each other. At each point in time, space diversity is applied, e.g., an antenna for which the direct wave and the reflected wave create constructive interference rather than destructive interference is used.

A transmit/receive (T/R) switch is a basic building block in many Radio Frequency (RF) front end circuits. Such switch is operative, for example, in determining whether a particular antenna will be used in a transmitting state or in receiving state.

For enhanced performance, the base station or handset of a mobile communication devices such as a cordless phone requires two switches, one for selecting the preferred antenna, and the other for selecting the communication direction—transmitting or receiving.

Traditional implementations of switching comprise Dual Pole Dual Trough (DPDT) switch which comprises two pairs of diodes plus peripheral components such as resistors, impedance matching components and others.

In order to reduce costs, it would be desired to place the switches on the chip. However, in commercial CMOS technologies, PIN diodes cannot be placed on the chip since PIN diodes are not available in CMOS processes or technologies.

In a preferred embodiment of the disclosure, a pair of switches is implemented as an arrangement of four transistors.

The suggested solution reduces multiple components external to the chip by integrating their functionality into the chip. The transistor switch is implemented in a standard CMOS process, and the associated networks are based on bond wires having high quality factor. The performance of the transistor switch is similar to the performance of the external diodes implementation.

The disclosed switch contains four (4) transistors. In some embodiments N-channel Metal Oxide Semiconductor (NMOS) transistors are used. Each transistor has its own individual control circuit and operates autonomously of the other transistors. The switch has 4 ports: two (2) for antennas, a transmission output port Tx and a receiving input Rx. On each state, the states being: transmitting from antenna 1, transmitting from antenna 2, receiving through antenna 1, receiving through antenna 2, exactly one transistor is in "on" state and forward biased, while the others are in "off" state. In order to achieve low insertion loss and high isolation, the other three transistors are reverse biased. The control circuit controls for each transistor its gate, drain and source. The arrangement and control circuits provide for low current consumption, such as few micro-ampere, e.g. under 10 µA, as well as high isolation and flexibility as compared to prior art switches.

Referring now to FIG. 1, showing a general illustration of an embodiment of the four transistor implementation of the DPDT switch.

The arrangement receives Tx signal 112 to be transmitted, and outputs received signal Rx 116. The circuit is further connected to antenna 1 (104) and antenna 2 (108).

The arrangement comprises four transistors: transistor 1 (120), transistor 2 (124), transistor 3 (128), and transistor 4 (132). Each transistor has its own control and voltages, and is opened or closed in accordance with the requirements. Thus, transistor 1 (120) is closed if and only if the unit is in transmission mode through antenna 1 (104) and is open at all other states, transistor 2 (124) is closed if and only if the unit is in receiving mode through antenna 1 (104) and is open at all other states, transistor 3 (128) is closed if and only if the unit is in transmission mode through antenna 2 (108) and is open at all other states, and transistor 4 (132) is closed if and only if the unit is in receiving mode through antenna 2 (108) and is open at all other states.

This arrangement enables the placement of the unit on the chip, such that no special substrate is required and silicone with standard doping such as 10 ohm-cm can be used.

The four transistor arrangement reduces the total equivalent parasitic capacitance of the three transistors that are in "off" state when the fourth transistor is in "on" state. In each switch state, all parasitic capacitances are in series and thus there is no need for an induction coil to reduce the total parasitic capacitance.

In the disclosed arrangement, each transistor receives the correct voltage according to whether it should be open or close. When any of the transistors requires a positive $V_{bias}$, the others require its negative value.

Figure 2:
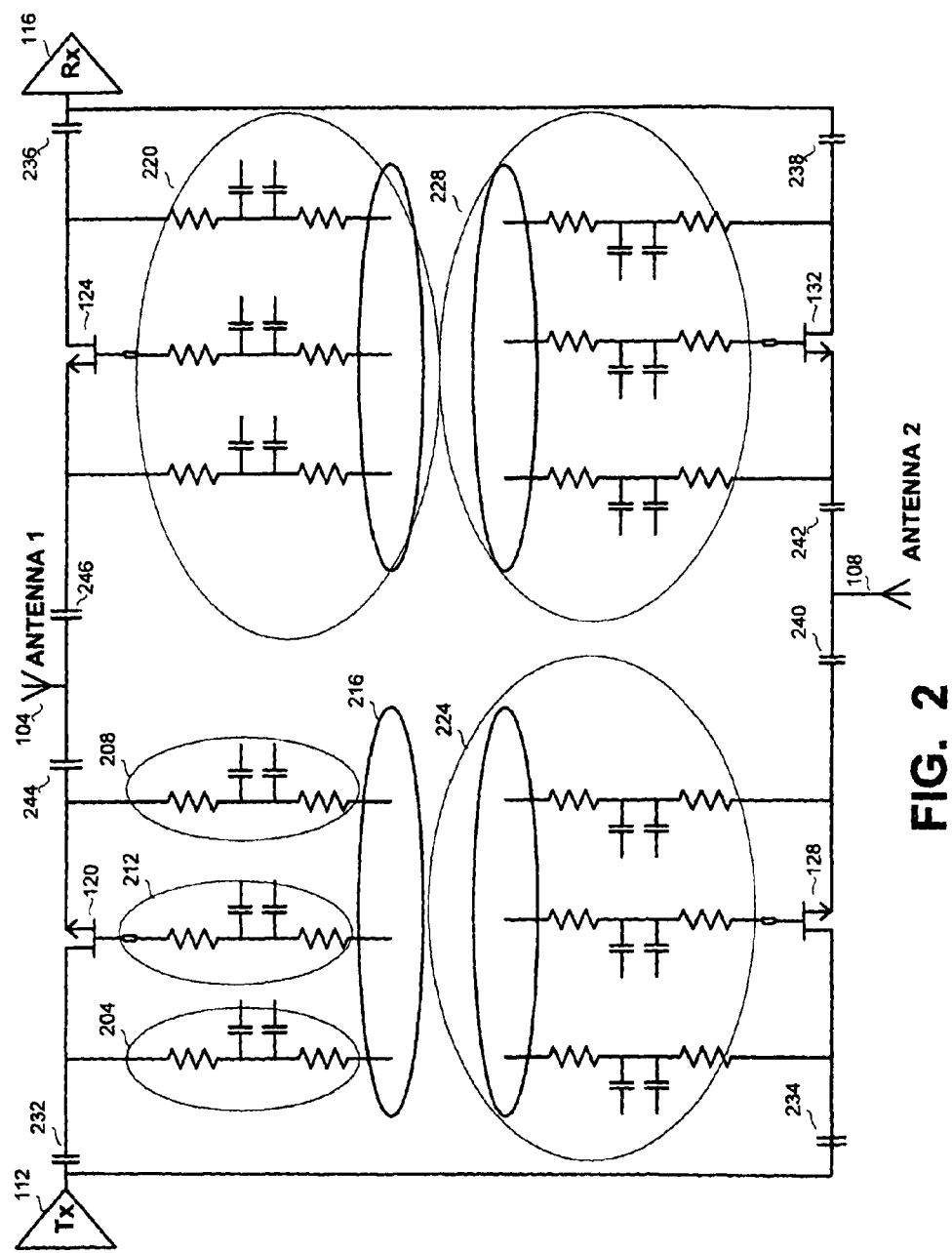
FIG. 2 is a detailed scheme of the four transistor implementation and its control circuits.

Referring now to FIG. 2, showing a more detailed scheme of the four transistor arrangement and its control circuits.

In order for each transistor to pass AC, it has to be placed on its gate DC voltage. For generating the DC voltage, components 204 provide the drain of transistor 1 (120) with zero or positive voltage, and components 208 provide the same voltage to the source of transistor 1 (120). Components 212 provide the complementary voltage to the gate of transistor 1 (120), the voltage alternating in accordance with a control signal between the zero or positive voltage of components 204, 208 and the complementary voltage of components 212, in order to open or close transistor 1 (120). Components 204, 208 and 212 are included in the control circuit of transistor 1 (120).

Components 204, 208 and 212 provide termination, so that the antenna has constant impedance relative to the ground. Each of components 204, 208 and 212 also serves as a low pass filter, which disables the signals from going back to their source.

Transistors 232, 234, 236, 238, 240, 242, 244 and 246 operate as DC blocks, eliminating DC from leaking from one transistor to the neighboring ones.

It will be appreciated that the disclosed control circuit is exemplary only, and other components can be used for enabling the transistors to function so that each of them is opened and closed at the correct timing in accordance with control signals. The transistors and all components can be placed on-chip, thus reducing the unit price.

It will also be appreciated that the components 204, 208, 212 and other components associated with transistor 1 (120) are representative, and that symmetric control circuits 220, 224 and 228 are provided for transistor 2 (124), transistor 3 (128), and transistor 4 (132), respectively.

In some embodiments, transmission 112 is passed through separate capacitors 232 and 234 in order to avoid DC coupling between transistor 1 (120) and transistor 2 (128), and similarly for capacitors 236 and 238.

The disclosed arrangement can be used also in environments in which only one antenna is available, such as in handsets. The reduced price and size may justify such usage over off-chip diode even if not all its functionality is used.

The disclosed arrangement is not limited to any type of devices, and can be used also for any other environments in which multiple switches are required, such as wireless local area network access points (WLAN AP), cellular phones, communication systems, radar systems or the like.

It will also be appreciated that the disclosed arrangement can be widened to include more transistors and control circuits for switching between more options, by using a switch matrix, such as an N×M matrix of elements, wherein each element can be implemented as a single series NMOS, an L series shunt combination, or a T/PI combination. Any of these combinations can be implemented as a complementary switch, comprising NMOS and PMOS.

It will be appreciated that various modifications and variations can be designed. For example, different peripheral components and control circuits can be used.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation, material, step of component to the teachings without departing from the essential scope thereof. Therefore, it is intended that the disclosed subject matter not be limited to the particular embodiment disclosed as the best mode contemplated for carrying out this invention, but only by the claims that follow.

What is claimed is:

1. A radio frequency (RF) switch that is coupled to a receiver, to a transmitter, to a first antenna and to a second antenna; wherein the RF switch comprises:
    a first transistor, a second transistor, a third transistor a fourth transistor, a first capacitor, a second capacitor, a third capacitor, a fourth capacitor, a fifth capacitor, a sixth capacitor, a seventh capacitor, and an eight capacitor;
    wherein only the first capacitor, the first transistor and the second capacitor are connected between the transmitter and the first antenna;
    wherein only the third capacitor, the second transistor and the fourth capacitor are connected between the receiver and the first antenna;
    wherein only the fifth capacitor, the third transistor and the sixth capacitor are connected between the transmitter and the second antenna;
    wherein only the seventh capacitor, the fourth transistor and the eighth capacitor are connected between the receiver and the second antenna;
    first, second, third and fourth control circuits configured to control the first, second, third and fourth transistors respectively and to place only one of said four transistors in an on state while placing the remaining three transistors in a reverse biased off state;
    a first low pass filter and termination circuit that is coupled between the first transistor and the first control circuit;

a second low pass filter and termination circuit that is coupled between the second transistor and the second control circuit; and a third low pass filter and termination circuit that is coupled between the third transistor and the third control circuit and a fourth low pass filter and termination circuit that is coupled between the fourth transistor and the fourth control circuit;

wherein each one of the first, second, third and fourth low pass filter and termination circuits comprises a pair of serially coupled first and second resistors and a pair of capacitors that are coupled in parallel to each other and are coupled to a junction between the first and second resistors.

2. A radio frequency (RF) switch that is coupled to a receiver, to a transmitter, to a first antenna and to a second antenna;

wherein the RF switch comprises:

a first transistor, a second transistor, a third transistor a fourth transistor, a first capacitor, a second capacitor, a third capacitor, a fourth capacitor, a fifth capacitor, a sixth capacitor, a seventh capacitor, and an eight capacitor; wherein only the first capacitor, the first transistor and the second capacitor are connected between the transmitter and the first antenna; wherein only the third capacitor, the second transistor and the fourth capacitor are connected between the receiver and the first antenna; wherein only the fifth capacitor, the third transistor and the sixth capacitor are connected between the transmitter and the second antenna; wherein only the seventh capacitor, the fourth transistor and the eighth capacitor are connected between the receiver and the second antenna;

first, second, third and fourth control circuits configured to control the first, second, third and fourth transistors respectively and to place only one of said four transistors in an on state while placing the remaining three transistors in a reverse biased off state;

a first low pass filter and termination circuit that is coupled between the first transistor and the first control circuit;

a second low pass filter and termination circuit that is coupled between the second transistor and the second control circuit; and a third low pass filter and termination circuit that is coupled between the third transistor and the third control circuit and a fourth low pass filter and termination circuit that is coupled between the fourth transistor and the fourth control circuit;

wherein the first low pass filter and termination circuit is arranged to provide a zero or a negative voltage to the drain of the first transistor, to provide a positive voltage to the source of first transistor and to provide an alternating voltage to the gate of the first transistor; wherein the second low pass filter and termination circuit is arranged to provide a zero or a negative voltage to the drain of the second transistor, to provide a positive voltage to the source of second transistor and to provide an alternating voltage to the gate of the second transistor; wherein the third low pass filter and termination circuit is arranged to provide a zero or a negative voltage to the drain of the third transistor, to provide a positive voltage to the source of third transistor and to provide an alternating voltage to the gate of the third transistor; and wherein the fourth low pass filter and termination circuit is arranged to provide a zero or a negative voltage to the drain of the fourth transistor, to provide a positive voltage to the source of fourth transistor and to provide an alternating voltage to the gate of the fourth transistor.

3. A radio frequency (RF) switch that is coupled to a receiver, to a transmitter, to a first antenna and to a second antenna; wherein the RF switch comprises:

a first transistor, a second transistor, a third transistor a fourth transistor, a first capacitor, a second capacitor, a third capacitor, a fourth capacitor, a fifth capacitor, a sixth capacitor, a seventh capacitor, and an eight capacitor;

wherein only the first capacitor, the first transistor and the second capacitor are connected between the transmitter and the first antenna;

wherein only the third capacitor, the second transistor and the fourth capacitor are connected between the receiver and the first antenna;

wherein only the fifth capacitor, the third transistor and the sixth capacitor are connected between the transmitter and the second antenna;

wherein only the seventh capacitor, the fourth transistor and the eighth capacitor are connected between the receiver and the second antenna;

first, second, third and fourth control circuits configured to control the first, second, third and fourth transistors respectively and to place only one of said four transistors in an on state while placing the remaining three transistors in a reverse biased off state;

a first low pass filter and termination circuit that is coupled between the first transistor and the first control circuit;

a second low pass filter and termination circuit that is coupled between the second transistor and the second control circuit; and a third low pass filter and termination circuit that is coupled between the third transistor and the third control circuit and a fourth low pass filter and termination circuit that is coupled between the fourth transistor and the fourth control circuit;

wherein the first low pass filter and termination circuit has a first set of components that is coupled to the drain of the first transistor, a second set of components that is coupled to the source of the first transistor and a third set of components that is coupled to the gate of the first transistor;

wherein the second low pass filter and termination circuit has a first set of components that is coupled to the drain of the second transistor, a second set of components that is coupled to the source of the second transistor and a third set of components that is coupled to the gate of the second transistor;

wherein the third low pass filter and termination circuit has a first set of components that is coupled to the drain of the third transistor, a second set of components that is coupled to the source of the third transistor and a third set of components that is coupled to the gate of the third transistor;

wherein the fourth low pass filter and termination circuit has a first set of components that is coupled to the drain of the fourth transistor, a second set of components that is coupled to the source of the fourth transistor and a third set of components that is coupled to the gate of the fourth transistor.

4. A wireless communication device having a handset and a base station, the base station comprising: a first antenna and a second antenna, a transmitter and a receiver, each of the first antenna and the second antenna operative to transmit and receive data; and a radio frequency (RF) switch located on a chip of the base station;

wherein the RF switch comprises:
  a first transistor, a second transistor, a third transistor a fourth transistor, a first capacitor, a second capacitor, a third capacitor, a fourth capacitor, a fifth capacitor, a sixth capacitor, a seventh capacitor, and an eight capacitor; wherein only the first capacitor, the first transistor and the second capacitor are connected between the transmitter and the first antenna; wherein only the third capacitor, the second transistor and the fourth capacitor are connected between the receiver and the first antenna; wherein only the fifth capacitor, the first third transistor and the sixth capacitor are connected between the transmitter and the second antenna; wherein only the seventh capacitor, the fourth transistor and the eighth capacitor are connected between the receiver and the second antenna;
  a first low pass filter and termination circuit that is coupled between the first transistor and the first control circuit; a second low pass filter and termination circuit that is coupled between the second transistor and the second control circuit; a third low pass filter and termination circuit that is coupled between the third transistor and the third control circuit and a fourth low pass filter and termination circuit that is coupled between the fourth transistor and the fourth control circuit;
  wherein each one of the first, second, third and fourth low pass filter and termination circuits comprises a pair of serially coupled first and second resistors and a pair of capacitors that are coupled in parallel to each other and are coupled to a junction between the first and second resistors.

5. A wireless communication device having a handset and a base station, the base station comprising: a first antenna and a second antenna, a transmitter and a receiver, each of the first antenna and the second antenna operative to transmit and receive data; and a radio frequency (RF) switch located on a chip of the base station;
  wherein the RF switch comprises:
    a first transistor, a second transistor, a third transistor a fourth transistor, a first capacitor, a second capacitor, a third capacitor, a fourth capacitor, a fifth capacitor, a sixth capacitor, a seventh capacitor, and an eight capacitor; wherein only the first capacitor, the first transistor and the second capacitor are connected between the transmitter and the first antenna; wherein only the third capacitor, the second transistor and the fourth capacitor are connected between the receiver and the first antenna; wherein only the fifth capacitor, the first third transistor and the sixth capacitor are connected between the transmitter and the second antenna; wherein only the seventh capacitor, the fourth transistor and the eighth capacitor are connected between the receiver and the second antenna;
    a first low pass filter and termination circuit that is coupled between the first transistor and the first control circuit; a second low pass filter and termination circuit that is coupled between the second transistor and the second control circuit; a third low pass filter and termination circuit that is coupled between the third transistor and the third control circuit and a fourth low pass filter and termination circuit that is coupled between the fourth transistor and the fourth control circuit;
  wherein the first low pass filter and termination circuit is arranged to provide a zero or a negative voltage to the drain of the first transistor, to provide a positive voltage to the source of first transistor and to provide an alternating voltage to the gate of the first transistor; wherein the second low pass filter and termination circuit is arranged to provide a zero or a negative voltage to the drain of the second transistor, to provide a positive voltage to the source of second transistor and to provide an alternating voltage to the gate of the second transistor; wherein the third low pass filter and termination circuit is arranged to provide a zero or a negative voltage to the drain of the third transistor, to provide a positive voltage to the source of third transistor and to provide an alternating voltage to the gate of the third transistor; and wherein the fourth low pass filter and termination circuit is arranged to provide a zero or a negative voltage to the drain of the fourth transistor, to provide a positive voltage to the source of fourth transistor and to provide an alternating voltage to the gate of the fourth transistor.

6. A wireless communication device having a handset and a base station, the base station comprising: a first antenna and a second antenna, a transmitter and a receiver, each of the first antenna and the second antenna operative to transmit and receive data; and a radio frequency (RF) switch located on a chip of the base station;
  wherein the RF switch comprises:
    a first transistor, a second transistor, a third transistor a fourth transistor, a first capacitor, a second capacitor, a third capacitor, a fourth capacitor, a fifth capacitor, a sixth capacitor, a seventh capacitor, and an eight capacitor; wherein only the first capacitor, the first transistor and the second capacitor are connected between the transmitter and the first antenna; wherein only the third capacitor, the second transistor and the fourth capacitor are connected between the receiver and the first antenna; wherein only the fifth capacitor, the first third transistor and the sixth capacitor are connected between the transmitter and the second antenna; wherein only the seventh capacitor, the fourth transistor and the eighth capacitor are connected between the receiver and the second antenna;
    a first low pass filter and termination circuit that is coupled between the first transistor and the first control circuit; a second low pass filter and termination circuit that is coupled between the second transistor and the second control circuit; a third low pass filter and termination circuit that is coupled between the third transistor and the third control circuit and a fourth low pass filter and termination circuit that is coupled between the fourth transistor and the fourth control circuit;
  wherein the first low pass filter and termination circuit has a first set of components that is coupled to the drain of the first transistor, a second set of components that is coupled to the source of the first transistor and a third set of components that is coupled to the gate of the first transistor;
  wherein the second low pass filter and termination circuit has a first set of components that is coupled to the drain of the second transistor, a second set of components that is coupled to the source of the second transistor and a third set of components that is coupled to the gate of the second transistor;
  wherein the third low pass filter and termination circuit has a first set of components that is coupled to the drain of the third transistor, a second set of components that is coupled to the source of the third transistor and a third set of components that is coupled to the gate of the third transistor;

wherein the fourth low pass filter and termination circuit has a first set of components that is coupled to the drain of the fourth transistor, a second set of components that is coupled to the source of the fourth transistor and a third set of components that is coupled to the gate of the fourth transistor.

* * * * *